United States Patent
Song et al.

(10) Patent No.: US 12,406,711 B2
(45) Date of Patent: Sep. 2, 2025

(54) CIRCUIT WITH LOGICAL FUNCTION OF COMPUTING-IN- MEMORY, MEMORY DEVICE, AND METHOD THEREOF

(71) Applicant: Taiwan Semiconductor Manufacturing Company, Ltd., Hsinchu (TW)

(72) Inventors: Ming-Yuan Song, Hsinchu (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 232 days.

(21) Appl. No.: 18/474,214

(22) Filed: Sep. 25, 2023

(65) Prior Publication Data
US 2025/0104754 A1 Mar. 27, 2025

(51) Int. Cl.
*G11C 11/16* (2006.01)
(52) U.S. Cl.
CPC ...... *G11C 11/1675* (2013.01); *G11C 11/1655* (2013.01); *G11C 11/1673* (2013.01); *G11C 11/1697* (2013.01)
(58) Field of Classification Search
CPC ............ G11C 11/1675; G11C 11/1655; G11C 11/1673; G11C 11/1697; G11C 11/1659
See application file for complete search history.

(56) References Cited

U.S. PATENT DOCUMENTS

| 12,051,456 | B2 * | 7/2024 | Kang | G11C 11/1697 |
| 2019/0206468 | A1 * | 7/2019 | El-Baraji | G11C 11/1673 |
| 2021/0210127 | A1 * | 7/2021 | Drouard | G11C 11/1675 |

FOREIGN PATENT DOCUMENTS

CN 111354392 B * 8/2023 ........... G11C 11/161

* cited by examiner

*Primary Examiner* — Sultana Begum
(74) *Attorney, Agent, or Firm* — JCIPRNET

(57) ABSTRACT

A circuit with a logical function of a computing-in-memory (CiM) operation, a memory device and a method thereof are provided. The circuit includes a first switch controlled by a first input data, a second switch controlled by an inverted first input data, a first and a second SOT MRAM cells, and a third switch controlled by a write word line. The first and the second SOT MRAM cells have a first and a second current paths for setting states of the first and the second SOT MRAM cells. In response to the third switch is turned-on, the state of the first SOT MRAM cell is different from the state of the second SOT MRAM cell. One of the state of the first SOT MRAM cell and the state of the second SOT MRAM cell is read according to one of the inverted first input data and the first input data.

20 Claims, 9 Drawing Sheets

XOR logical function

| IN (INA) \ WBL (INB) | WBL=+1 (INB=enable) | WBL=-1 (INB=disable) |
|---|---|---|
| IN=1 (INA=enable) | AP | P |
| IN=0 (INA=disable) | P | AP |

(A)

XNOR logical function

| IN (INA) \ WBL (INB) | WBL=+1 (INB=enable) | WBL=-1 (INB=disable) |
|---|---|---|
| IN=1 (INA=enable) | P | AP |
| IN=0 (INA=disable) | AP | P |

(B)

FIG. 5

CIRCUIT WITH LOGICAL FUNCTION OF COMPUTING-IN- MEMORY, MEMORY DEVICE, AND METHOD THEREOF

BACKGROUND

As the artificial intelligence evolves and advances, memory architectures for performing computing-in-memory (CiM) have drawn enormous attention from the field. In order to enable CiM to realize various logical operations, it is necessary to realize these logical operations through corresponding circuit structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 illustrates a table presenting the states of spin-orbit torque (SOT) magneto-resistive random-access memory (MRAM) cells in the circuit of FIG. 2 with the exclusive-or (XOR) logical function or the exclusive-nor (XNOR) logical function in accordance with some embodiments.

DESCRIPTION OF THE EMBODIMENTS

Figure 1:
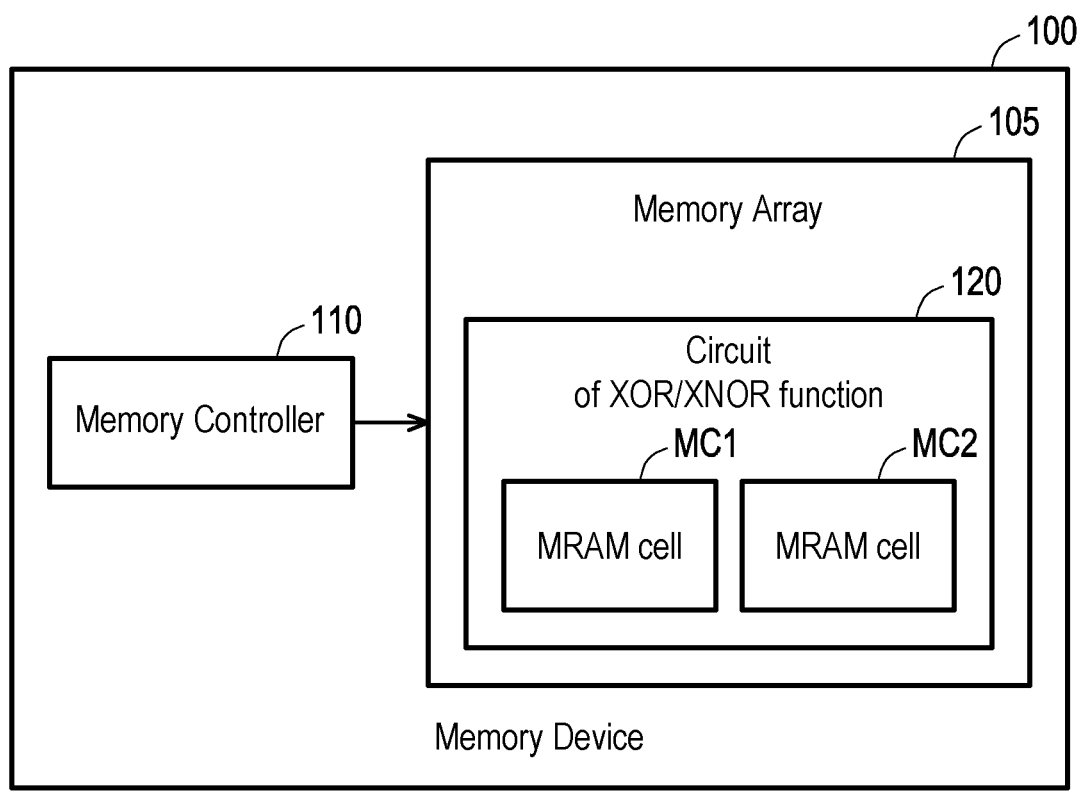
FIG. 1 illustrates a schematic diagram of a memory device for performing computing-in-memory (CiM) operation in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic diagram of a memory device for performing computing-in-memory (CiM) operation in accordance with some embodiments. The memory device 100 includes a memory array 105 and a memory controller 110. The memory array 105 at least has multiple memory cells, i.e., spin-orbit torque (SOT) magneto-resistive random-access memory (MRAM) cells MC1 and MC2. The memory array 105 includes a circuit 120 with a logical function of the CiM operation. In the embodiment, the circuit 120 performs the logical function is an exclusive-or (XOR) function or an exclusive-nor (XNOR) function, and the following embodiment takes the circuit 120 with the XOR function as example. The memory controller 110 is coupled to the circuit 120 of the memory array 105. The memory controller 110 applies a write word line WWL, a first input data INA, a second input data INB to perform the XOR/XNOR logical function of the CiM operation by controlling the circuit 120.

Figure 2:
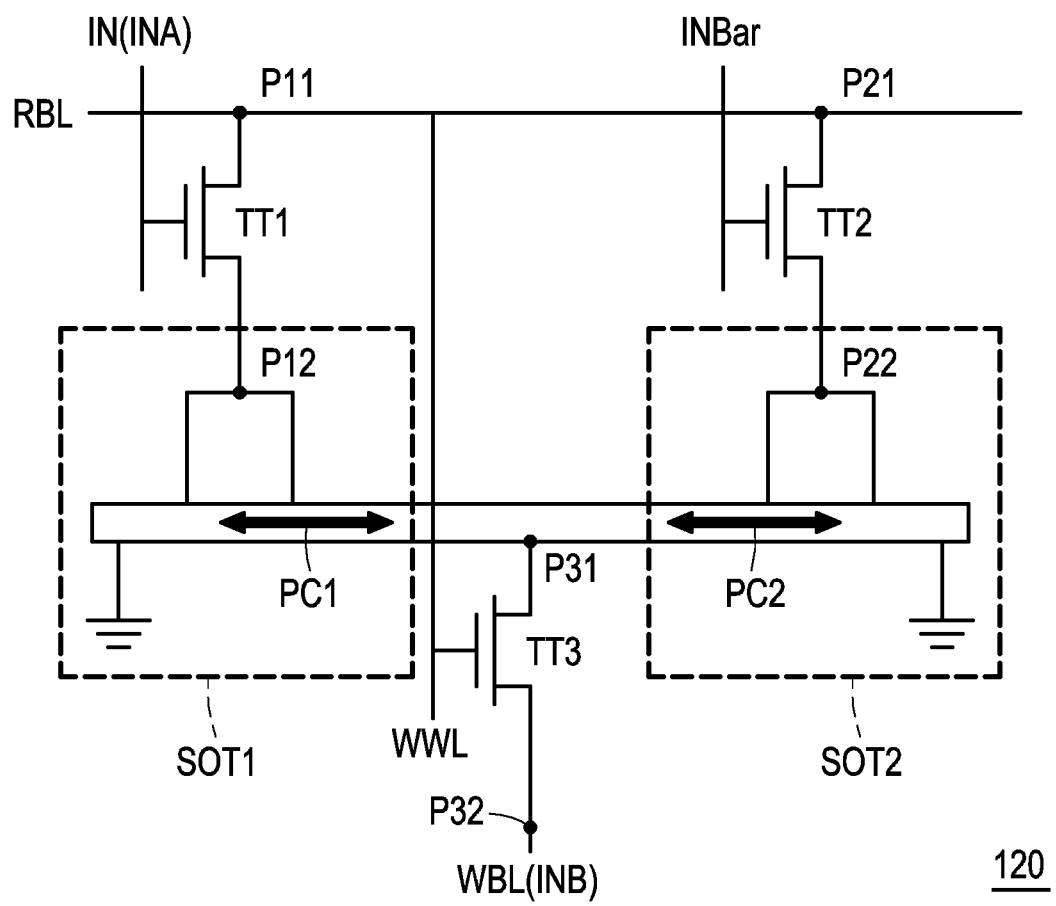
FIG. 2 illustrates a circuit with a logical function of a CiM operation in the memory device of FIG. 1 in accordance with some embodiments.

FIG. 2 illustrates the circuit 105 with the logical function of the CiM operation in the memory device of FIG. 1 in accordance with some embodiments. The circuit 120 includes a first switch (i.e., a first transistor TT1), a second switch (i.e., a second transistor TT2), a first SOT MRAM cell SOT1, a second SOT MRAM cell SOT2, and a third switch (i.e., a third transistor TT3). A first node P11 of the first transistor TT1 is coupled to a read bit line RBL, a control node of the first transistor TT1 is received an input signal (i.e., a first input data INA), and a second node P12 of the first transistor TT1 is coupled to a bit line node of the first SOT MRAM cell SOT1. A first node P21 of the second transistor TT2 is coupled to the read bit line RBL, a control node of the second transistor TT2 is received an inverted input signal (i.e., an inverted first input data INBar), and a second node P22 of the second transistor TT2 is coupled to a bit line node of the second SOT MRAM cell SOT2. The inverted first input data INBar is an inverted signal of the first input data INA.

The first SOT MRAM cell SOT1 has a first current path PC1 for setting a state of the first SOT MRAM cell SOT1. In detail, the first current path PC1 is a path from the first node of the first SOT MRAM cell SOT1 (one terminal of the first current path PC1) to the second node of the first SOT MRAM cell SOT1 (the other terminal of the first current path PC1). The second node of the first SOT MRAM cell SOT1 is coupled to a predetermined voltage terminal (i.e., the ground terminal) in the embodiment. The second SOT MRAM cell SOT2 also has a second current path PC2 for setting a state of the second SOT MRAM cell. The second current path PC2 is a path from the first node of the second SOT MRAM cell SOT2 (one terminal of the second current path PC2) to the second node of the second SOT MRAM cell SOT2 (the other terminal of the second current path PC2). The second node of the first SOT MRAM cell SOT1 is coupled to a predetermined voltage terminal (i.e., the ground terminal) in the embodiment. In detail, the first current path PC1 and the second current path PC2 are in the heavy metal layer of the SOT MRAM cells SOT1 and SOT2. While a current passing through the first current path PC1 or the second current path PC2, the states in the magnetic tunnel junction (MTJ) layers of the first and the second SOT MRAM cells SOT1 and SOT2 are set or changed according to the current direction of the first current path PC1 or the second current path PC2.

A first node of the third transistor TT3 is coupled to the first node of the first SOT MRAM cell SOT1 and the first node of the second SOT MRAM cell SOT2. The second node P32 of the third transistor TT3 is coupled to a write bit line WBL corresponding to the second input data INB. The control node of the third switch TT3 is coupled to a write word line WWL. In response to the write word line WWL is enabled (i.e., the write word line WWL is in an enable state), the third switch TT3 is turned-on and the first node P31 and the second node P32 are electrical connected together. In response to the write word line WWL is disabled (i.e., the write word line WWL is in an disable state), the third switch TT3 is cut-off and the first node P31 and the second node P32 are not electrical connected.

Figure 3:
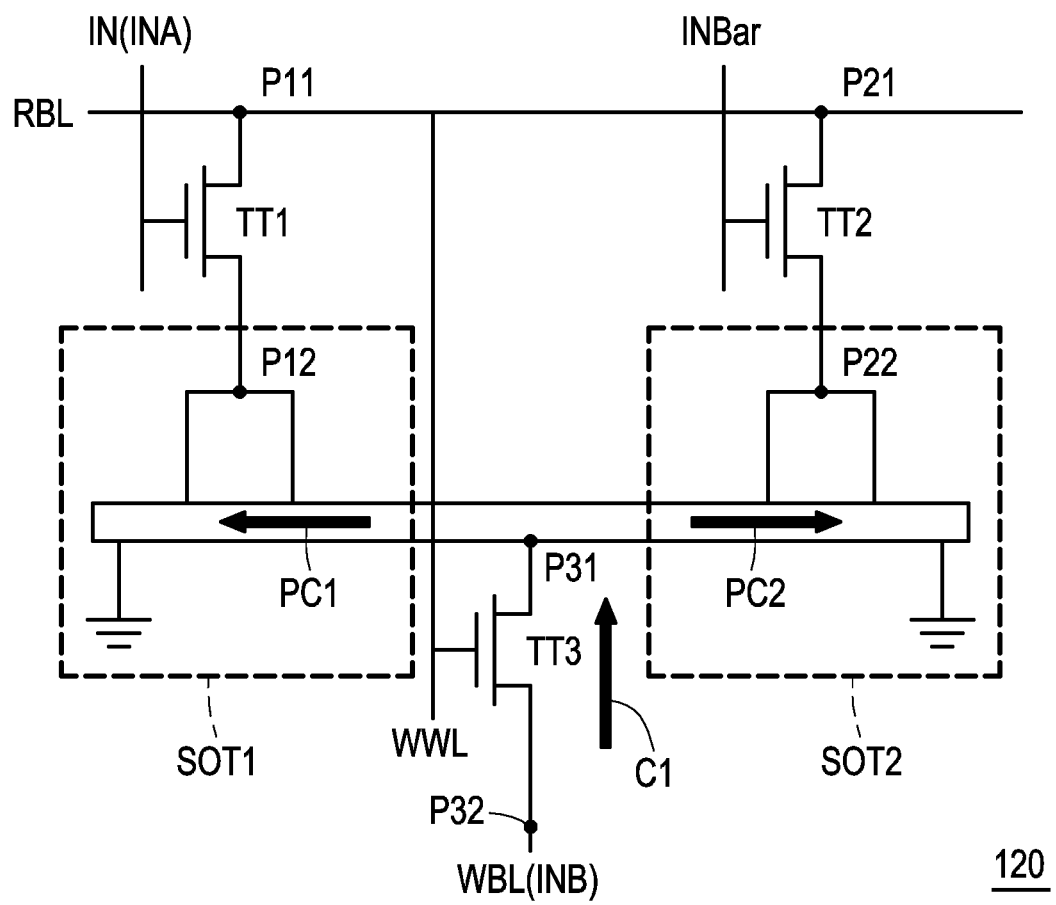
FIG. 3 and FIG. 4 illustrate operations with the circuit of FIG. 2 in accordance with some embodiments.
Figure 4:
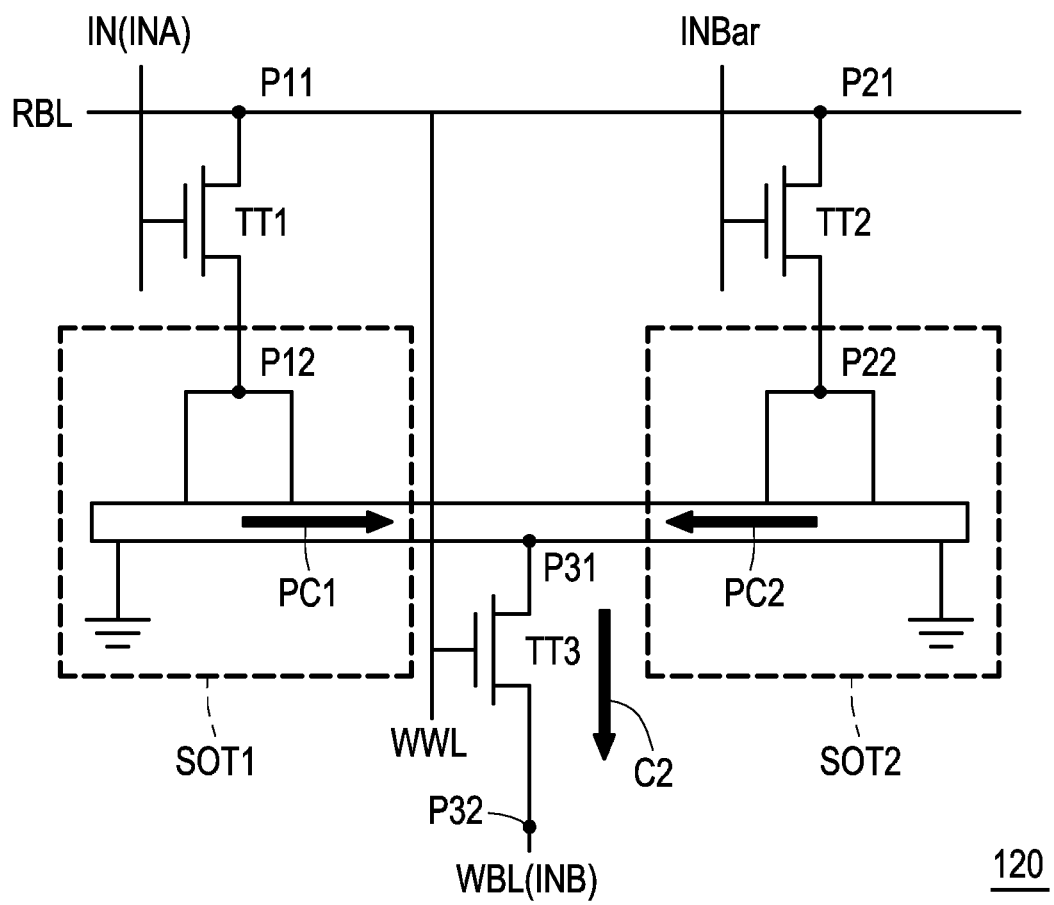

FIG. 3 and FIG. 4 illustrate operations with the circuit of FIG. 2 in accordance with some embodiments. In FIG. 3, while the third switch TT3 is turned-on according to the write word line WWL, in response to the second input data INB is enabled, the write bit line WBL is set as '+1' (positive voltage) and the voltage of the write bit line WBL is larger than the predetermined voltage (0V) of the predetermined voltage terminal (ground terminal). Thus, the current C1 produced by the voltage of the write bit line WBL corresponding to the second input data INB and the predetermined voltage (0V) of the predetermined voltage terminal (ground terminal) is split to flow through the first current path PC1 and the second current path PC2 to set the state of the first SOT MRAM cell SOT1 as an anti-parallel (AP) state and to set the state of the second SOT MRAM cell SOT2 as a parallel (P) state at the same time.

In FIG. 4, while the third switch TT3 is turned-on according to the write word line WWL, in response to the second input data INB is disabled, the write bit line WBL is set as '−1' (negative voltage) and the voltage of the write bit line WBL is larger than the predetermined voltage (0V) of the predetermined voltage terminal (ground terminal). Thus, the current C2 produced by the voltage of the write bit line WBL corresponding to the second input data INB and the predetermined voltage (0V) of the predetermined voltage terminal (ground terminal) is split to flow through the first current path PC1 and the second current path PC2 to set the state of the first SOT MRAM cell SOT1 as the parallel (P) state and to set the state of the second SOT MRAM cell SOT2 as the anti-parallel (AP) state at the same time. The current direction in the first current path PC1 of FIG. 3 is opposite to the current direction in the first current path PC1 of FIG. 4, and the current direction in the second current path PC2 of FIG. 3 is also opposite to the current direction in the second current path PC2 of FIG. 4.

In other words, based on functions of the SOT MRAM cells SOT1 and SOT2 and the current paths PC1 and PC2 through the third transistor TT3 of FIG. 2 to FIG. 4, the states of the SOT MRAM cells SOT1 and SOT2 are set, reset or changed at the same time, and the state of the first SOT MRAM cell SOT1 is different from the second SOT MRAM cell SOT2.

The memory controller 110 applies the second input data INB to adjust the voltage of the write bit line WBL to set the states of the SOT MRAM cells SOT1 and SOT2, and further applies the first input data INA to selectively read one of the state of the first SOT MRAM cell and the state of the second SOT MRAM cell. In detail, while the memory controller 110 applies the first input data INA with enable state (the input signal IN is logic '1'), the memory controller 110 reads the state of the left/first SOT MRAM cell SOT1 ('AP' state); while the memory controller 110 applies the first input data INA with disable state (the input signal IN is logic '0'), the memory controller 110 reads the state of the right/second SOT MRAM cell SOT2 ('P' state).

FIG. 5 illustrates a table presenting the states of SOT MRAM cells in the circuit of FIG. 2 with the exclusive-or (XOR) logical function or the exclusive-nor (XNOR) logical function in accordance with some embodiments. According to the left table (A) of FIG. 5, the XOR logical function is done by the circuit 120 of FIG. 2 to FIG. 4, while the first input data INA is enabled (i.e., input signal IN=1) and the second input data INB is enabled (i.e., write bit line WBL='+1'), or while the first input data INA is disabled (i.e., input signal IN=0) and the second input data INB is disabled (i.e., write bit line WBL='−1'), the state of the left/first SOT MRAM cell SOT1 is 'AP' state for presenting the logic '1'. While the first input data INA is enabled (i.e., input signal IN=1) and the second input data INB is disabled (i.e., write bit line WBL='−1'), or while the first input data INA is disabled (i.e., input signal IN=0) and the second input data INB is enabled (i.e., write bit line WBL='+1'), the state of the right/second SOT MRAM cell SOT1 is 'P' state for presenting the logic '0'.

According to the right table (B) of FIG. 5, the XNOR logical function is done by the circuit 120 of FIG. 2 to FIG. 4, while the first input data INA is enabled (i.e., input signal IN=1) and the second input data INB is enabled (i.e., write bit line WBL='+1'), or while the first input data INA is disabled (i.e., input signal IN=0) and the second input data INB is disabled (i.e., write bit line WBL='−1'), the state of the left/first SOT MRAM cell SOT1 is the 'P' state for presenting the logic '0'. While the first input data INA is enabled (i.e., input signal IN=1) and the second input data INB is disabled (i.e., write bit line WBL='−1'), or while the first input data INA is disabled (i.e., input signal IN=0) and the second input data INB is enabled (i.e., write bit line WBL='+1'), the state of the right/second SOT MRAM cell SOT1 is the 'AP' state for presenting the logic '1'.

Figure 6:
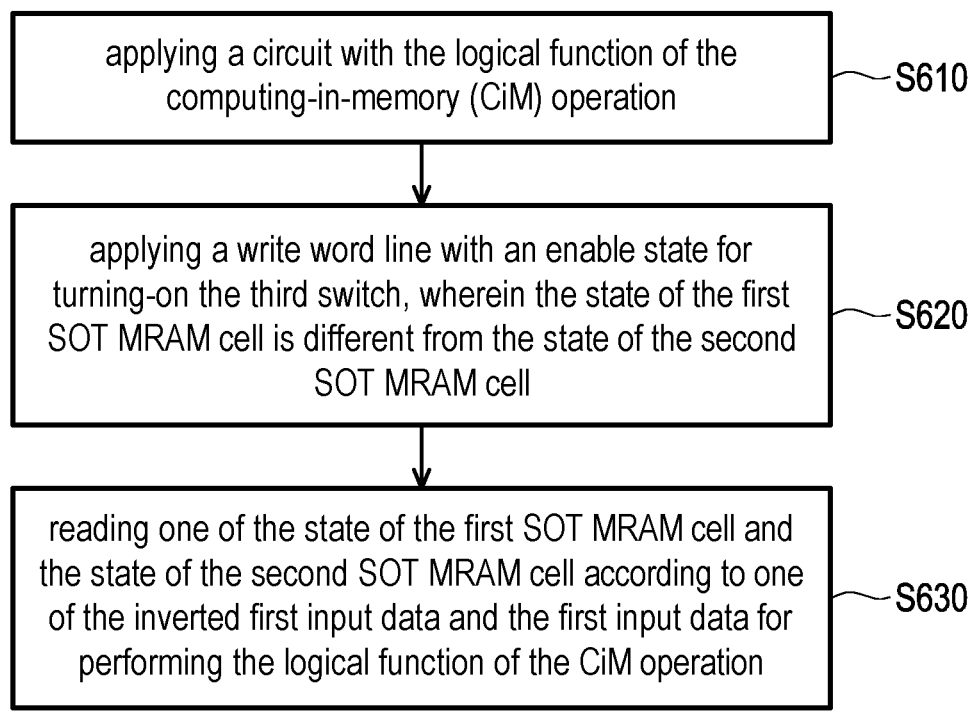
FIG. 6 illustrates simulation and verification with the circuit of FIG. 2 in accordance with some embodiments.

FIG. 6 illustrates a method for a computing-in-memory (CiM) operation in accordance with some embodiments. In step S610, the memory controller 110 of FIG. 1 applies a circuit 120 of FIG. 2 with the XOR/XNOR logical function of CiM operation, wherein the circuit 120 includes a first switch (a first transistor TT1) controlled by a first input data INA, a second switch (a second transistor TT2) controlled by an inverted first input data INBar, a first SOT MRAM cell SOT1, a second SOT MRAM cell SOT2, and a third switch (a third transistor TT3) controlled by a write word line WWL, the first SOT MRAM cell SOT1 has a first current path PC1 for setting a state of the first SOT MRAM cell SOT1, the second SOT MRAM cell SOT2 has a second current path PC2 for setting a state of the second SOT MRAM cell SOT2, one terminal of the first current path PC1 and one terminal of the second current path PC2 are coupled to a predetermined voltage terminal (a ground terminal), the third switch (third transistor TT3) is controlled by a write word line WWL. In step S610, the memory controller 110 of FIG. 1 applies the write word line WWL with an enable state for turning-on the third switch, wherein a current is produced by a voltage of the write bit line WBL coupled to the third switch corresponding to the second input data INB and the predetermined voltage (0V) of the predetermined voltage terminal (ground terminal), the current is split to flow through the first current path PC1 and the second current path PC2 to set the states of the first SOT MRAM cell SOT1 and the second SOT MRAM cell SOT2 at the same time.

The state of the first SOT MRAM cell SOT1 is different from the state of the second SOT MRAM cell SOT2, and the write bit line WBL is coupled to one node of the third switch. In step S630, the memory controller 110 of FIG. 1 reads one of the state of the first SOT MRAM cell SOT1 and the state of the second SOT MRAM cell SOT2 according to one of the inverted first input data INBar and the first input data INA for performing the logical function of the CiM operation.

Figure 7:
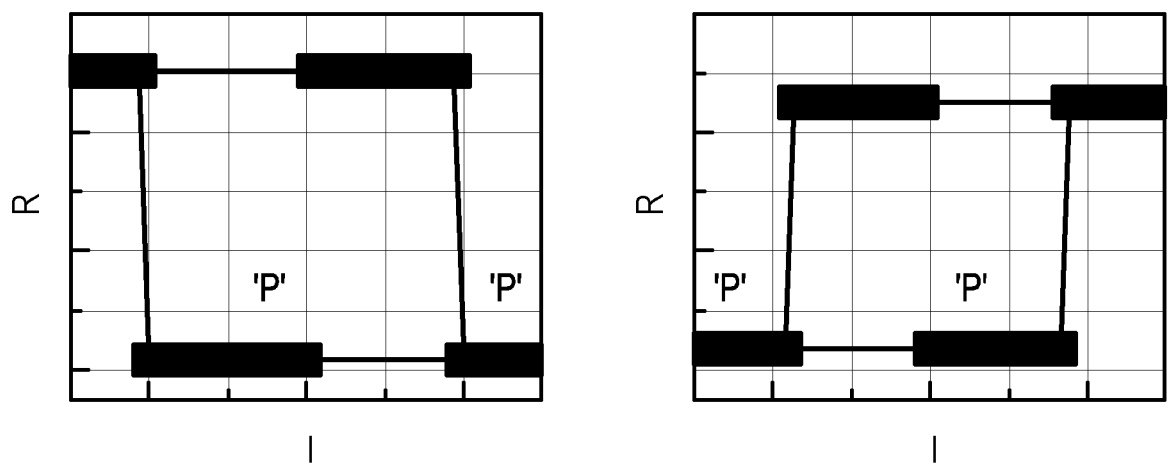
FIG. 7 illustrates simulation and verification with the circuit of FIG. 2 in accordance with some embodiments.

FIG. 7 illustrates simulation and verification of the circuit of FIG. 2 in accordance with some embodiments. After simulation and verification of the circuit of FIG. 2, it shows a stable resistance (R) current (I) waveform in FIG. 7 presenting the 'AP' states and the 'P' states of the SOT MRAM cell SOT1 and SOT2, and thus the XOR/XNOR logical function can be implemented by the memory device 100 of FIG. 1 and the circuit 120 of FIG. 2 to FIG. 4.

Figure 8A:
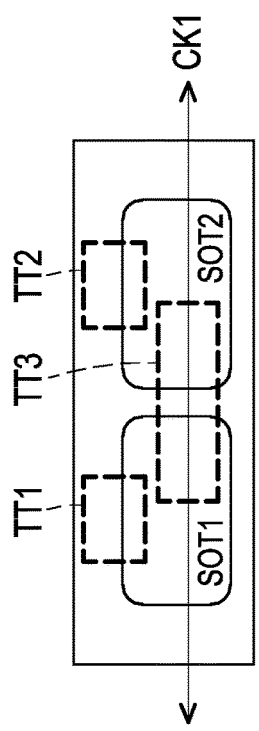
FIGS. 8A-8B and FIGS. 9A-9B illustrate cross-sectional views showing a semiconductor layout of the circuit of FIG. 2 in two sections lines in accordance with some embodiments.
Figure 8B:
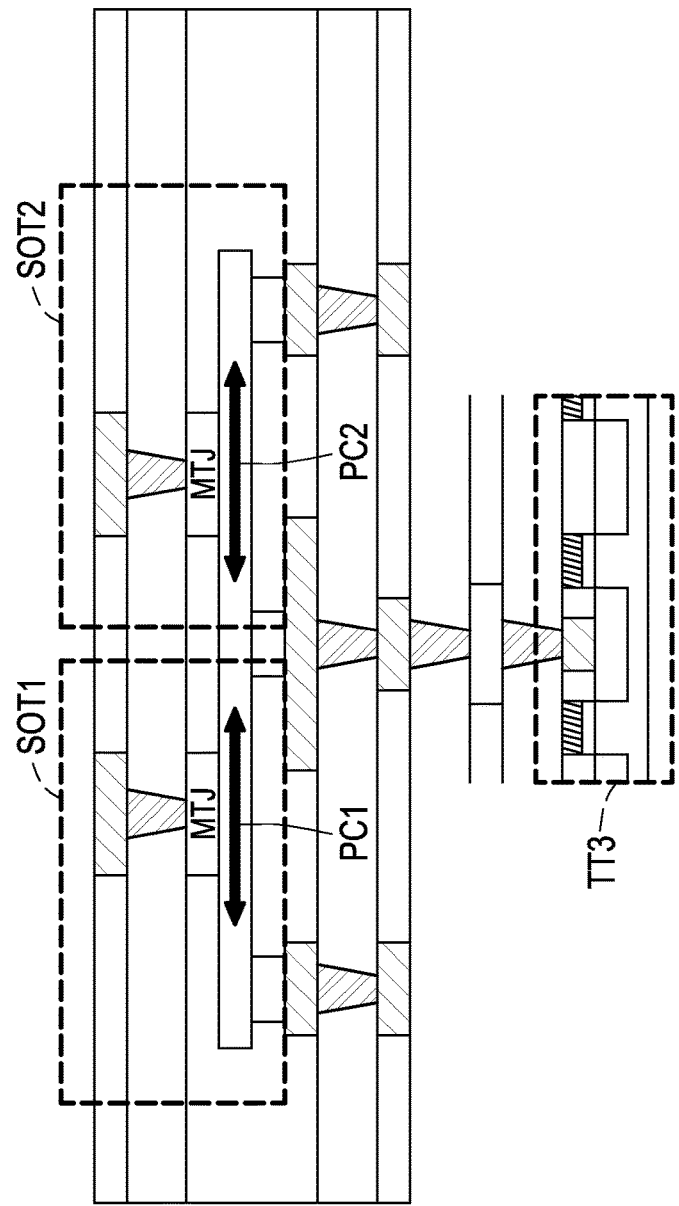
Figure 9A:
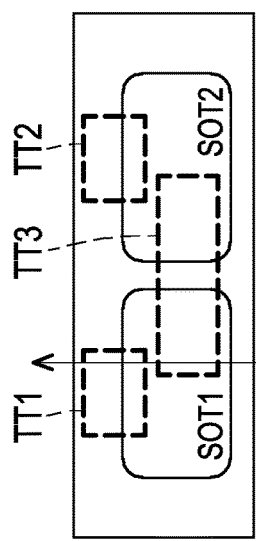
Figure 9B:
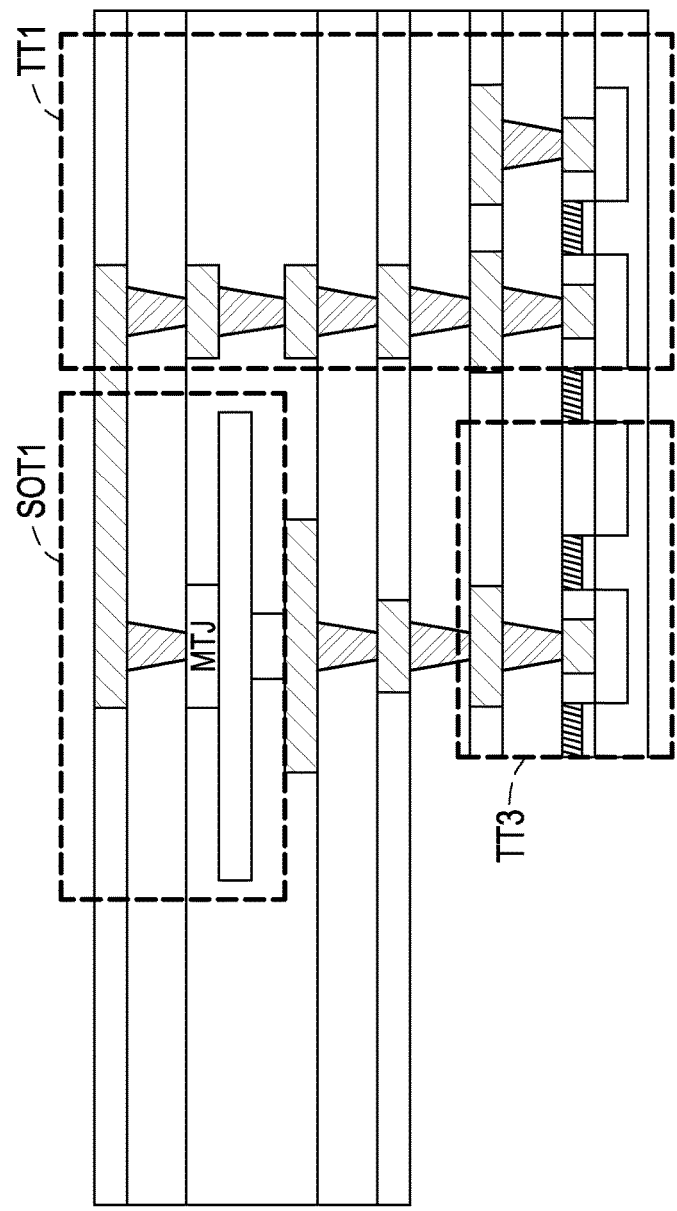

FIGS. 8A-8B and FIGS. 9A-9B illustrate cross-sectional views showing a semiconductor layout of the circuit 120 of FIG. 2 in two sections lines CK1 and CK2 in accordance with some embodiments. FIG. 8A presents the schematic semiconductor layout of the circuit 120 of FIG. 2 in a top-down view. FIG. 8B presents the cross-sectional view according to the cross-sectional view sections line CK1 on the X-axis in FIG. 8A. The cross-sectional view in FIG. 8B presents a layer distribution of the third transistor TT3, the SOT MRAM cell SOT1 and SOT2, and, the first and the second transistor TT1 and TT2 are not shown in FIG. 8B. FIG. 9A presents the schematic semiconductor layout of the circuit 120 of FIG. 2 in a top-down view. FIG. 9B presents the cross-sectional view according to the cross-sectional view sections line CK2 on the Y-axis in FIG. 9A. The cross-sectional view in FIG. 9B presents layer distribution of the first and the third transistors TT0 and TT3, the SOT MRAM cell SOT1 and SOT2, and, the second transistor TT2 is not shown in FIG. 9B.

In summary, the circuit 120 with the XOR/XNOR logical function of the CiM operation, the memory device and the method thereof can make the XOR/XNOR logical function faster than other circuits for implementing the XOR/XNOR logical function with six transistors or with three transistors plus two Spin-transfer torque (STT) MRAM cells because the SOT MRAM cells SOT1 and SOT2 in the circuit are set or adjusted at the same time as the third transistor TT3 is turned-on, and the state of the first SOT MRAM cell SOT1 is different from the second SOT MRAM cell SOT2 based on functions of the SOT MRAM cells SOT1 and SOT2 and the current paths PC1 and PC2 through the third transistor TT3 of FIG. 2 to FIG. 4.

In accordance with an embodiment, A circuit with a logical function s for performing a computing-in-memory (CiM) operation. The circuit comprises a first switch, a second switch, a first spin-orbit torque (SOT) magneto-resistive random-access memory (MRAM) cell, a second SOT MRAM cell, and a third switch. The first switch is coupled to a read bit line and is controlled by a first input data. The second switch is coupled to the read bit line and is controlled by an inverted first input data, wherein the inverted first input data is an inverted signal of the first input data. A bit-line node of the first SOT MRAM cell is coupled to the first switch, the first SOT MRAM cell has a first current path for setting a state of the first SOT MRAM cell. A bit-line node of the second SOT MRAM cell is coupled to the second switch, the second SOT MRAM cell has a second current path for setting a state of the second SOT MRAM cell, one terminal of the first current path and one terminal of the second current path are coupled to a predetermined voltage terminal. The third switch is coupled to a write bit line corresponding to a second input data, the other terminal of the first current path, and one terminal of the second current path, and the third switch is controlled by a write word line. In response to the third switch is turned-on according to the write word line, a current produced by a voltage of the write bit line corresponding to the second input data and a predetermined voltage of the predetermined voltage terminal is split to flow through the first current path and the second current path to set the states of the first SOT MRAM cell and the second SOT MRAM cell at the same time, the state of the first SOT MRAM cell is different from the state of the second SOT MRAM cell. And, one of the state of the first SOT MRAM cell and the state of the second SOT MRAM cell is read according to one of the inverted first input data and the first input data.

In accordance with an embodiment, a memory device comprises a memory array and a memory controller. The memory array comprises a circuit with a logical function of a computing-in-memory (CiM) operation. The memory controller is coupled to the circuit of the memory array, applying a write word line, a first input data, a second input data to perform the logical function of the CiM operation by controlling the circuit. The circuit comprises a first switch, a second switch, a first spin-orbit torque (SOT) magneto-resistive random-access memory (MRAM) cell, a second SOT MRAM cell, and a third switch. The first switch is coupled to a read bit line and is controlled by a first input data. The second switch is coupled to the read bit line and is controlled by an inverted first input data, wherein the inverted first input data is an inverted signal of the first input data. A bit-line node of the first SOT MRAM cell is coupled to the first switch, the first SOT MRAM cell has a first current path for setting a state of the first SOT MRAM cell. A bit-line node of the second SOT MRAM cell is coupled to the second switch, the second SOT MRAM cell has a second current path for setting a state of the second SOT MRAM cell, one terminal of the first current path and one terminal of the second current path are coupled to a predetermined voltage terminal. The third switch is coupled to a write bit line corresponding to a second input data, the other terminal of the first current path, and one terminal of the second current path, and the third switch is controlled by a write word line. In response to the third switch is turned-on according to the write word line, a current produced by a voltage of the write bit line corresponding to the second input data and a predetermined voltage of the predetermined voltage terminal is split to flow through the first current path and the second current path to set the states of the first SOT MRAM cell and the second SOT MRAM cell at the same time, the state of the first SOT MRAM cell is different from the state of the second SOT MRAM cell. And, one of the state of the first SOT MRAM cell and the state of the second SOT MRAM cell is read according to one of the inverted first input data and the first input data.

In accordance with an embodiment, a method for a computing-in-memory (CiM) operation, comprising following steps: applying a circuit with the logical function of the computing-in-memory (CiM) operation, wherein the circuit includes a first switch controlled by a first input data, a second switch controlled by an inverted first input data, a first SOT MRAM cell, a second SOT MRAM cell, and a third switch controlled by a write word line, the first SOT MRAM cell has a first current path for setting a state of the first SOT MRAM cell, the second SOT MRAM cell has a second current path for setting a state of the second SOT MRAM cell, one terminal of the first current path and one terminal of the second current path are coupled to a predetermined voltage terminal, the third switch is controlled by a write word line; applying the write word line with an enable state for turning-on the third switch, wherein a current is produced by a voltage of the write bit line coupled to the third switch corresponding to the second input data and a predetermined voltage of the predetermined voltage terminal, the current is split to flow through the first current path and the second current path to set the states of the first SOT MRAM cell and the second SOT MRAM cell at the same time, the state of the first SOT MRAM cell is different from the state of the second SOT MRAM cell, the write bit line is coupled to one node of the third switch; and, reading one of the state of the first SOT MRAM cell and the state of the second SOT MRAM cell according to one of the inverted first input data and the first input data for performing the logical function of the CiM operation.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A circuit with a logical function of a computing-in-memory (CiM) operation, comprising:
   a first switch, coupled to a read bit line and controlled by a first input data;
   a second switch, coupled to the read bit line and controlled by an inverted first input data, wherein the inverted first input data is an inverted signal of the first input data;
   a first spin-orbit torque (SOT) magneto-resistive random-access memory (MRAM) cell, a bit-line node of the first SOT MRAM cell is coupled to the first switch, the first SOT MRAM cell has a first current path for setting a state of the first SOT MRAM cell;
   a second SOT MRAM cell, a bit-line node of the second SOT MRAM cell is coupled to the second switch, the second SOT MRAM cell has a second current path for setting a state of the second SOT MRAM cell, one terminal of the first current path and one terminal of the second current path are coupled to a predetermined voltage terminal; and
   a third switch, coupled to a write bit line corresponding to a second input data, the other terminal of the first current path, and one terminal of the second current path, and the third switch is controlled by a write word line,
   wherein in response to the third switch is turned-on according to the write word line, a current produced by a voltage of the write bit line corresponding to the second input data and a predetermined voltage of the predetermined voltage terminal is split to flow through the first current path and the second current path to set the states of the first SOT MRAM cell and the second SOT MRAM cell at the same time, the state of the first SOT MRAM cell is different from the state of the second SOT MRAM cell, and, one of the state of the first SOT MRAM cell and the state of the second SOT MRAM cell is read according to one of the inverted first input data and the first input data.

2. The circuit of claim 1, wherein a first node of the third switch is coupled to the one terminal of the first current path and the one terminal of the second current path, a second node of the third transistor is coupled to the write bit line with the second input data,
   wherein the third switch is turned-on and the voltage of the write bit line is larger than the predetermined voltage according to the second input data, the current is split to flow from the one terminal of the first current path to the other terminal of the first current path and to flow from the one terminal of the second current path to the other terminal of the second current path, the state of the first SOT MRAM cell is an anti-parallel (AP) state and the state of the second SOT MRAM cell is a parallel (P) state.

3. The circuit of claim 2, wherein the third switch is turned-on and the voltage of the second input data is lower than the predetermined voltage according to the second input data, the current is split to flow from the other terminal of the first current path to the one terminal of the first current path and to flow from the other terminal of the second current path to the one terminal of the second current path, the state of the first SOT MRAM cell is the P state and the state of the second SOT MRAM cell is the AP state.

4. The circuit of claim 3, wherein in response to the second input data is enabled, the voltage of the second input data is larger than the predetermined voltage, and,
   in response to the first input data is disabled, the voltage of the second input data is lower than the predetermined voltage.

5. The circuit of claim 1, wherein in response to the first input data is enabled, the first switch is turned-on, the second switch is cut-off, and the state of the first SOT MRAM cell is read by the read bit line, and,
   in response to the first input data is disabled, the first switch is cut-off, the second switch is turned-on, and the state of the second SOT MRAM cell is read by the read bit line.

6. The circuit of claim 1, wherein the predetermined voltage terminal is ground terminal, and the predetermined voltage is 0V.

7. The circuit of claim 1, wherein the first switch, the second switch, and the third switch are transistors, a control node of the first switch is received the first input data, a control node of the second switch is received the inverted first input data, and a control node of the third switch is coupled to the write word line.

8. The circuit of claim 1, wherein the circuit performs the logical function is an exclusive-or (XOR) function or an exclusive-nor (XNOR) function.

9. A memory device, comprising:
   a memory array, comprising a circuit with a logical function of a CiM operation; and
   a memory controller, coupled to the circuit of the memory array, applying a write word line, a first input data, a second input data to perform the logical function of the CiM operation by controlling the circuit,
   wherein the circuit comprising:
   a first switch, coupled to a read bit line and controlled by a first input data;
   a second switch, coupled to the read bit line and controlled by an inverted first input data, wherein the inverted first input data is an inverted signal of the first input data;

a first SOT MRAM cell, a bit-line node of the first SOT MRAM cell is coupled to the first switch, the first SOT MRAM cell has a first current path for setting a state of the first SOT MRAM cell;

a second SOT MRAM cell, a bit-line node of the second SOT MRAM cell is coupled to the second switch, the second SOT MRAM cell has a second current path for setting a state of the second SOT MRAM cell, one terminal of the first current path and one terminal of the second current path are coupled to a predetermined voltage terminal; and a third switch, coupled to a write bit line corresponding to the second input data, the other terminal of the first current path, and one terminal of the second current path, and the third switch is controlled by a write word line, wherein in response to the third switch is turned-on according to the write word line, a current produced by a voltage of the write bit line corresponding to the second input data and a predetermined voltage of the predetermined voltage terminal is split to flow through the first current path and the second current path to set the states of the first SOT MRAM cell and the second SOT MRAM cell at the same time, the state of the first SOT MRAM cell is different from the state of the second SOT MRAM cell, and, one of the state of the first SOT MRAM cell and the state of the second SOT MRAM cell is read according to one of the inverted first input data and the first input data.

10. The memory device of claim 9, wherein a first node of the third switch is coupled to the one terminal of the first current path and the one terminal of the second current path, a second node of the third transistor is coupled to the write bit line with the second input data, wherein the third switch is turned-on and the voltage of the write bit line is larger than the predetermined voltage according to the second input data, the current is split to flow from the one terminal of the first current path to the other terminal of the first current path and to flow from the one terminal of the second current path to the other terminal of the second current path, the state of the first SOT MRAM cell is an anti-parallel (AP) state and the state of the second SOT MRAM cell is a parallel (P) state.

11. The memory device of claim 10, wherein the third switch is turned-on and the voltage of the write bit line is lower than the predetermined voltage according to the second input data, the current is split to flow from the other terminal of the first current path to the one terminal of the first current path and to flow from the other terminal of the second current path to the one terminal of the second current path, the state of the first SOT MRAM cell is the P state and the state of the second SOT MRAM cell is the AP state.

12. The memory device of claim 11, wherein in response to the second input data is enabled, the voltage of the write bit line is larger than the predetermined voltage, and, in response to the first input data is disabled, the voltage of the write bit line is lower than the predetermined voltage.

13. The memory device of claim 9, wherein in response to the first input data is enabled, the first switch is turned-on, the second switch is cut-off, and the state of the first SOT MRAM cell is read by the read bit line, and, in response to the first input data is disabled, the first switch is cut-off, the second switch is turned-on, and the state of the second SOT MRAM cell is read by the read bit line.

14. The memory device of claim 9, wherein the predetermined voltage terminal is ground terminal, and the predetermined voltage is 0V.

15. The memory device of claim 9, wherein the first switch, the second switch, and the third switch are transistors, a control node of the first switch is received the first input data, a control node of the second switch is received the inverted first input data, and a control node of the third switch is coupled to the write word line.

16. The memory device of claim 9, wherein the circuit performs the logical function is an XOR function or an XNOR function.

17. A method for a CiM operation, comprising:

applying a circuit with the logical function of the CiM operation, wherein the circuit includes a first switch controlled by a first input data, a second switch controlled by an inverted first input data, a first SOT MRAM cell, a second SOT MRAM cell, and a third switch controlled by a write word line, the first SOT MRAM cell has a first current path for setting a state of the first SOT MRAM cell, the second SOT MRAM cell has a second current path for setting a state of the second SOT MRAM cell, one terminal of the first current path and one terminal of the second current path are coupled to a predetermined voltage terminal, the third switch is controlled by a write word line;

applying the write word line with an enable state for turning-on the third switch, wherein a current is produced by a voltage of the write bit line coupled to the third switch corresponding to the second input data and a predetermined voltage of the predetermined voltage terminal, the current is split to flow through the first current path and the second current path to set the states of the first SOT MRAM cell and the second SOT MRAM cell at the same time, the state of the first SOT MRAM cell is different from the state of the second SOT MRAM cell, the write bit line is coupled to one node of the third switch; and reading one of the state of the first SOT MRAM cell and the state of the second SOT MRAM cell according to one of the inverted first input data and the first input data for performing the logical function of the CiM operation.

18. The method of claim 17, wherein a first node of the third switch is coupled to the one terminal of the first current path and the one terminal of the second current path, a second node of the third transistor is coupled to the write bit line with the second input data, wherein the method further comprises:

applying the second input data with an enable state while the third switch is turned-on, wherein the voltage of the write bit line is larger than the predetermined voltage according to the second input data, the current is split to flow from the one terminal of the first current path to the other terminal of the first current path and to flow from the one terminal of the second current path to the other terminal of the second current path, the state of the first SOT MRAM cell is an AP state and the state of the second SOT MRAM cell is a P state; and applying the second input data with an disable state while the third switch is turned-on, wherein the voltage of the write bit line is lower than the predetermined voltage according to the second input data, the current is split to flow from the other terminal of the first current path to the one terminal of the first current path and to flow from the other terminal of the second current path to the one terminal of the second current path, the state of the first SOT MRAM cell is the P state and the state of the second SOT MRAM cell is the AP state.

19. The method of claim 17, further comprises:
in response to the first input data is enabled, the first switch is turned-on, the second switch is cut-off, and the state of the first SOT MRAM cell is read by the read bit line, and,
in response to the first input data is disabled, the first switch is cut-off, the second switch is turned-on, and the state of the second SOT MRAM cell is read by the read bit line.

20. The memory device of claim 17, wherein the circuit performs the logical function is an XOR function or an XNOR function.

\* \* \* \* \*